(12) United States Patent
Delano

(10) Patent No.: US 6,414,560 B2
(45) Date of Patent: Jul. 2, 2002

(54) LOOP DELAY COMPENSATION FOR A DIGITAL POWER AMPLIFIER

(75) Inventor: Cary L. Delano, Los Altos, CA (US)

(73) Assignee: Tripath Technology, Inc., Santa Clara, CA (US)

( * ) Notice: Subject to any disclaimer, the term of this patent is extended or adjusted under 35 U.S.C. 154(b) by 0 days.

(21) Appl. No.: 09/796,634

(22) Filed: Feb. 28, 2001

Related U.S. Application Data
(60) Provisional application No. 60/186,830, filed on Mar. 3, 2000.

(51) Int. Cl.[7] .............................. H03C 1/06; H03C 3/08; H03F 3/38
(52) U.S. Cl. ........................ 332/107; 332/109; 332/123; 332/162; 330/10; 455/126
(58) Field of Search .................... 332/107, 109–111, 332/123, 159, 162; 330/10; 375/238; 455/63, 126

(56) References Cited

U.S. PATENT DOCUMENTS

| | | | |
|---|---|---|---|
| 4,843,339 A | 6/1989 | Burt et al. | |
| 5,023,566 A | 6/1991 | El-Hamamsy et al. | 330/251 |
| 5,352,986 A | 10/1994 | Modgil | |
| 5,479,337 A | 12/1995 | Voigt | 363/131 |
| 5,610,553 A | 3/1997 | Kirn | 330/10 |
| 5,777,512 A | 7/1998 | Tripathi et al. | 330/207 A |
| 5,909,153 A | * | 6/1999 | Delano et al. | 332/107 |

FOREIGN PATENT DOCUMENTS

| | | | |
|---|---|---|---|
| EP | 0 616 422 A1 | 9/1994 | H03F/3/217 |

OTHER PUBLICATIONS

Karsten Nielson, "High–Fidelity PWM–Based Amplifier Concept For Active Loudspeaker Systems With Very Low Energy Consumption", J. Audio Eng. Soc., vol. 45 No. 7/8, Jul./Aug. 1997, pp. 555–570.

James C. Candy, et al., "Oversampling Methods for A/D and D/A Conversation," *Oversampling Delta–Sigma Data Converters*, 1992, New York, *IEEE*., pp. 1–29.

H. Ballan, et al., "12V—Class–D Amplifier in 5V CMOS Technology," 1995, Switzerland, *IEEE*, pp. 559–562.

T. Ritoniemi, et al., "Design of Stable High Order 1–Bit Sigma–Delta Modulators," May 1990, Finland, *IEEE*, pp. 127–130.

\* cited by examiner

*Primary Examiner*—David Mis
(74) *Attorney, Agent, or Firm*—Beyer Weaver & Thomas, LLP

(57) ABSTRACT

A modulator loop is described having an associated band pass frequency range and including a switching stage having a first delay associated therewith. The modulator loop also includes a modulator stage having a feedback input. The output of the modulator stage is coupled to the input of the switching stage. A first feedback path is coupled between the output of the switching stage and the modulator stage. A notch filter corresponding to the band pass frequency range is coupled between the output of the modulator stage and the feedback input of the modulator stage for compensating for the first delay.

15 Claims, 8 Drawing Sheets

LOOP DELAY COMPENSATION FOR A DIGITAL POWER AMPLIFIER

RELATED APPLICATION DATA

The present application claims priority from U.S. Provisional Patent Application No. 60/186,830 for LOOP DELAY COMPENSATION FOR AN RF DIGITAL POWER AMPLIFIER filed on Mar. 3, 2000, the entirety of which is incorporated herein by reference for all purposes. The subject matter of the present application also relates to the subject matter described in U.S. Pat. No. 5,909,153 for METHOD AND APPARATUS FOR COMPENSATING FOR DELAYS IN MODULATOR LOOPS issued Jun. 1, 1999, the entirety of which is incorporated herein by reference for all purposes.

BACKGROUND OF THE INVENTION

The present invention relates to delay handling in modulator loops. More specifically, the present invention provides a filter in the modulator loop which compensates for delays introduced by, for example, a power switching stage or an output filter.

With pulse width modulation (PWM) and other modulation techniques, the delay introduced by switching and output filter stages must be effectively dealt with to alleviate the adverse effects such delays have on circuit stability. This is particularly true for modulators which have relatively high power switching stages because the delays can become very large with respect to the pulse repetition frequency of the loop. A traditional solution to the problem of delay handling will be described with reference to FIGS. 1 and 2.

FIG. 1 is a block diagram of a typical modulator loop 100. The logic output of modulator 102 drives an inverting power stage 104 the output of which is filtered by output filter 106. A feedback resistor 108 and attenuation resistor 112 are provided for the purpose of introducing negative feedback from the output of the loop to modulator 102. FIG. 2 shows two waveforms 202 and 204 from the modulator loop of FIG. 1 without delay compensation. As shown, due to the delay introduced by the switching and filter stages, the positive swing of waveform 204 (i.e., the output filter 106) is nearly in phase with the positive swing of waveform 202 (i.e., the logic output of modulator 102).

Thus, where the original design of the loop contemplates negative feedback, the delay converts it to positive feedback and therefore loop instability (not shown) results. For this reason, a filter capacitor 110 is provided in parallel with feedback resistor 108 for delay compensation. Capacitor 110 produces a zero in the feedback loop, effectively bypassing the attenuation caused by resistors 108 and 112 for high frequencies.

Unfortunately, because this type of delay compensation is performed after the delay has been introduced into the loop, it is difficult to correct all of the delay's negative consequences with regard to loop stability. In fact, this type of compensation technique has had only limited success and, as a result, has limited the delay tolerance and the overall performance of today's modulators. One solution is to use feedback signals directly from the logic output of the modulator, i.e., before the delay is introduced, in combination with the output of the power stage and/or the output filter. Unfortunately, while the output of the modulator (202) and the filter output (204) have similar characteristics there are significant differences in content in the modulator loop's frequency range of interest due to the non-ideal nature of the power stage as discussed in commonly assigned U.S. Pat. No. 5,974,089 for METHOD AND APPARATUS FOR PERFORMANCE IMPROVEMENT BY QUALIFYING PULSES IN AN OVERSAMPLED, NOISE-SHAPING SIGNAL PROCESSOR issued on Oct. 26, 1999, the entirety of which is incorporated herein by reference for all purposes. This makes it very difficult to achieve high fidelity operation while feeding these signals back.

In view of the foregoing, it is desirable to provide an improved technique for compensating for delays in modulator loops such that greater delays may be tolerated without adversely affecting loop stability.

SUMMARY OF THE INVENTION

According to the present invention, a feedback technique for modulator loops is introduced which addresses the difficulties discussed above. The feedback technique described herein uses the output of a low voltage modulator stage to compensate for the delay introduced by subsequent power and filter stages while, at the same time, achieving a high level of fidelity notwithstanding the differences in signal content as discussed above. The invention achieves this result by filtering the output of the modulator stage such that its frequency components outside of the modulator loop's frequency range of interest are transmitted to the feedback path while its frequency components inside the loop's range of interest are attenuated. Thus, the stability of the loop is enhanced due to the feeding back of some portion of the modulator output, while the fidelity of the output spectrum of the loop is not adversely affected by undesirable modulator output components within the range.

Depending upon the type of modulator, the frequencies attenuated and transmitted by the feedback filter of the present invention vary. For example, for a baseband modulator, the filter attenuates frequencies in the baseband and transmits higher frequencies such as, for example, a high pass filter. For a band pass modulator, the feedback filter may behave like a notch filter, attenuating frequencies within the relevant band. Similarly, for a band reject modulator, the filter may behave like a band pass filter, while for a high pass modulator, the filter may behave like a low pass filter.

In a modulator loop which tolerates a 250 ns delay without the improvements of the present invention, the addition of the feedback technique described herein has been shown to increase the delay tolerance level to greater than 500 ns. This means that, according to the present invention, very large power devices may be employed with low voltage modulators despite the troublesome delays associated with such power devices. For example, a specific embodiment of the invention is capable of delivering more than 1000 W (>1 hp!) into a 4 ohm load with very high fidelity. For a 1 ohm load (e.g., an industrial motor) this is the equivalent of more than 5 hp! This is a significant improvement over currently available high fidelity modulator loops and is sufficient for many relatively high power industrial applications.

Thus the present invention provides a modulator loop having an associated band pass frequency range and including a switching stage having a first delay associated therewith. The modulator loop also includes a modulator stage having a feedback input. The output of the modulator stage is coupled to the input of the switching stage. A first feedback path is coupled between the output of the switching stage and the modulator stage. A notch filter corresponding to the band pass frequency range is coupled between the output of the modulator stage and the feedback input of the modulator stage for compensating for the first delay.

A further understanding of the nature and advantages of the present invention may be realized by reference to the remaining portions of the specification and the drawings.

DETAILED DESCRIPTION OF SPECIFIC EMBODIMENTS

Figure 1:
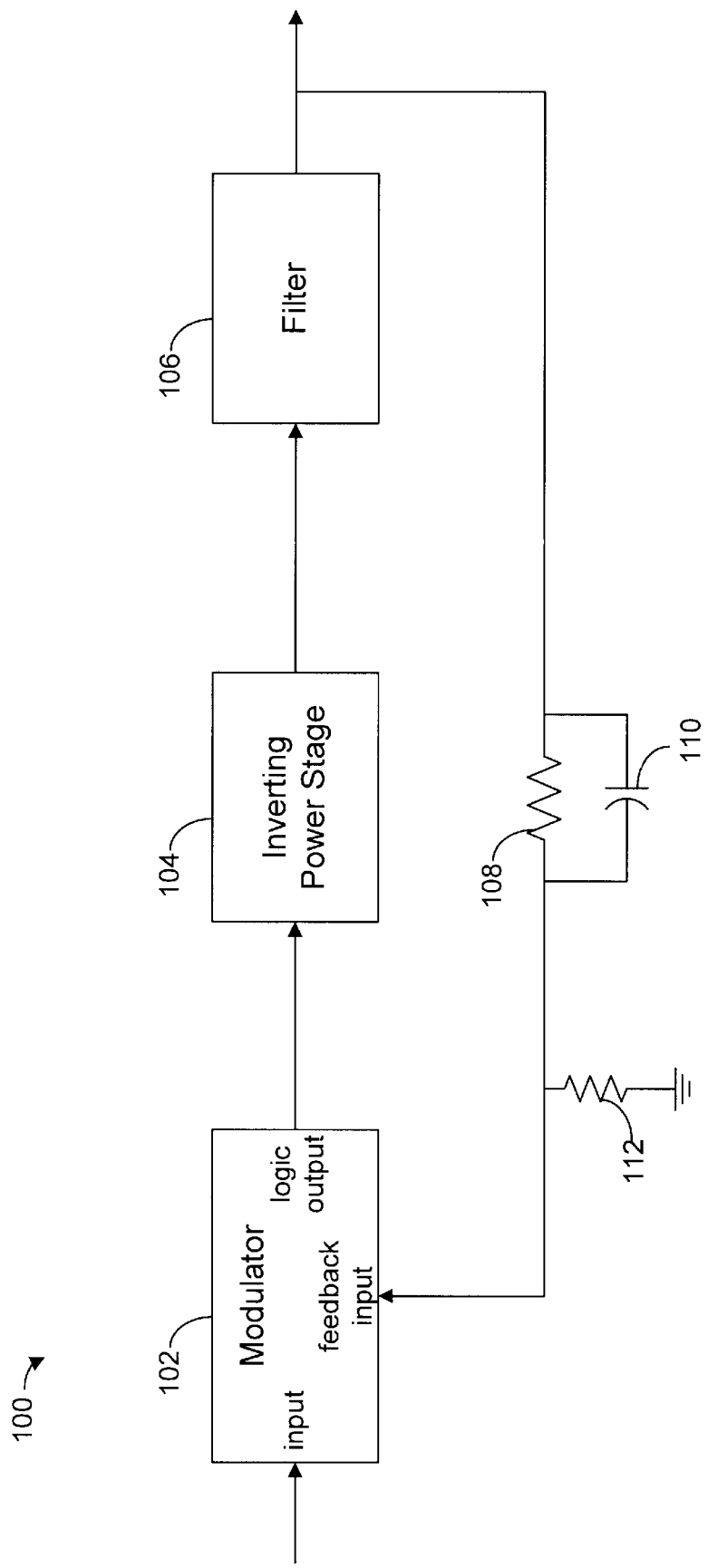
FIG. 1 is a block diagram of a modulator loop designed according to the prior art.
Figure 2:
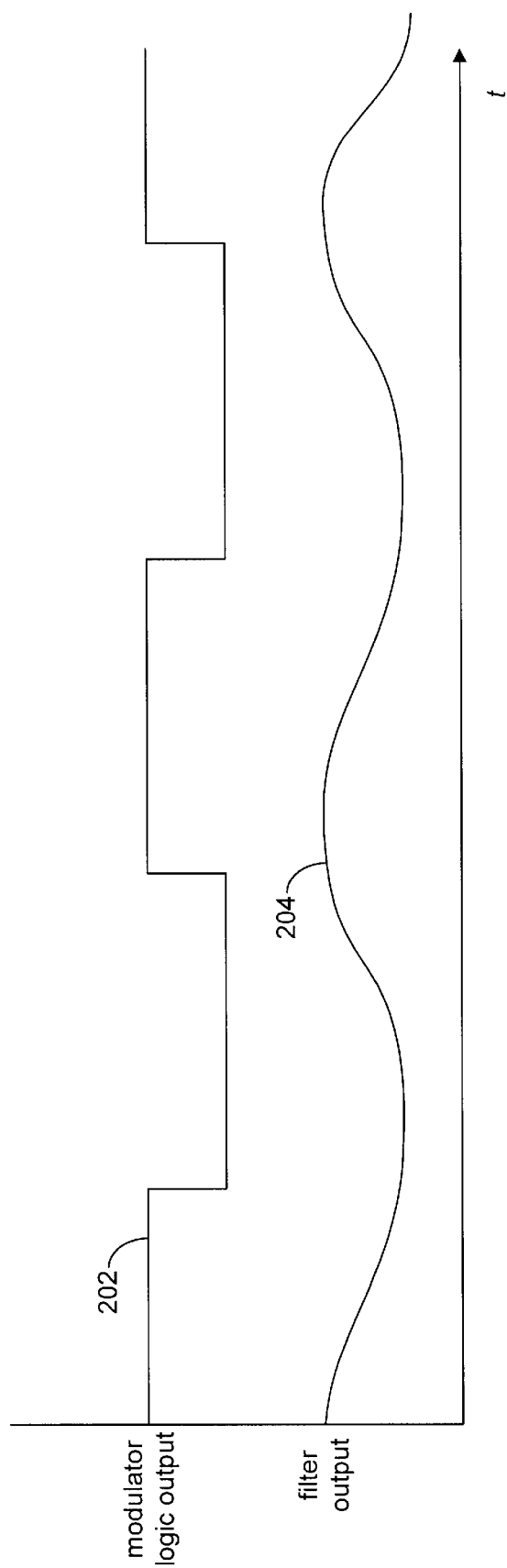
FIG. 2 shows two waveforms from the modulator loop of FIG. 1.
Figure 3:
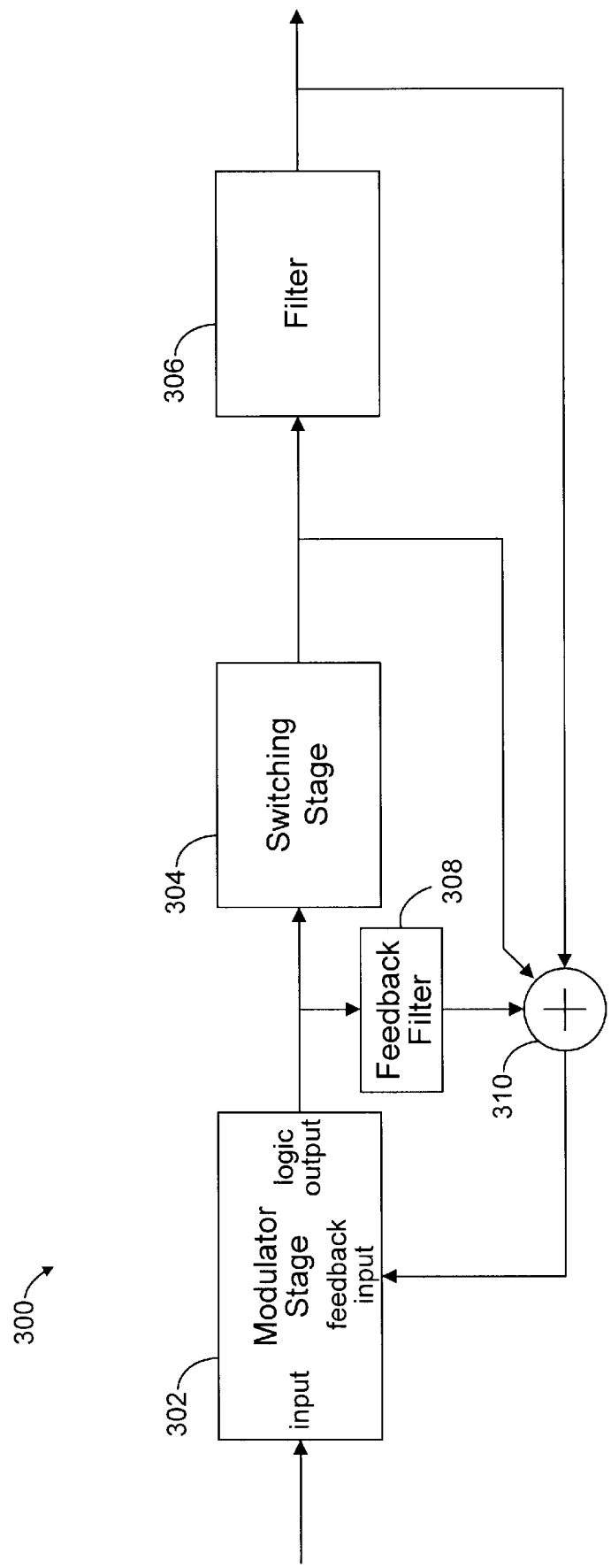
FIG. 3 is a block diagram of a modulator loop designed according to a specific embodiment of the invention.

FIG. 3 is a block diagram of a modulator loop 300 designed according to a specific embodiment of the invention. Modulator stage 302 may be any of a wide variety of modulator types including, for example, a pulse width modulator, or an oversampled mixed-signal modulator such as the one described in commonly assigned, copending U.S. Pat. No. 5,777,512 for METHOD AND APPARATUS FOR OVERSAMPLED, NOISE-SHAPING, MIXED-SIGNAL PROCESSING issued Jul. 7, 1998, the entire disclosure of which is incorporated herein by reference for all purposes. According to specific embodiments, modulator stage 302 comprises a plurality of filters in parallel and/or in series. Switching stage 304 receives a control signal from the output of modulator 302. Switching stage 304 may be any of a wide variety of switch configurations and power levels. Switching stage 304 may also be either inverting or noninverting. For an inverting switching stage, an inverter is inserted in the modulator output feedback path in front of feedback filter 308. Output filter 306 may also be implemented according to any of a wide variety of techniques as appropriate for the desired output signal content in a particular application.

As with previous designs, negative feedback may be provided to modulator 302 from the outputs of switching stage 304 and/or output filter 306 via summing junction 310. For purposes of this description, junction 310 is assumed to be ideal and therefore, no additional feedback circuitry is shown. However, it will be understood that summing junction 310 must, of necessity, be implemented using actual circuit components such as, for example, resistors. Therefore, specific embodiments of the invention showing some actual implementations of summing junction 310 are described below with reference to FIGS. 4–6. The frequency content of the feedback from the switching stage and output filter is both inside and outside of the loop's frequency range of interest.

Unlike previous designs, the modulator loop 300 also employs feedback from the output of modulator 302 via feedback filter 308 to further enhance loop stability. However, to avoid the negative consequences for output fidelity discussed in the Background of the Invention, this feedback is filtered by filter 308 such that its frequency content is largely outside of the modulator loop's frequency range of interest. Thus, stability is increased without loss of fidelity.

Figure 4:
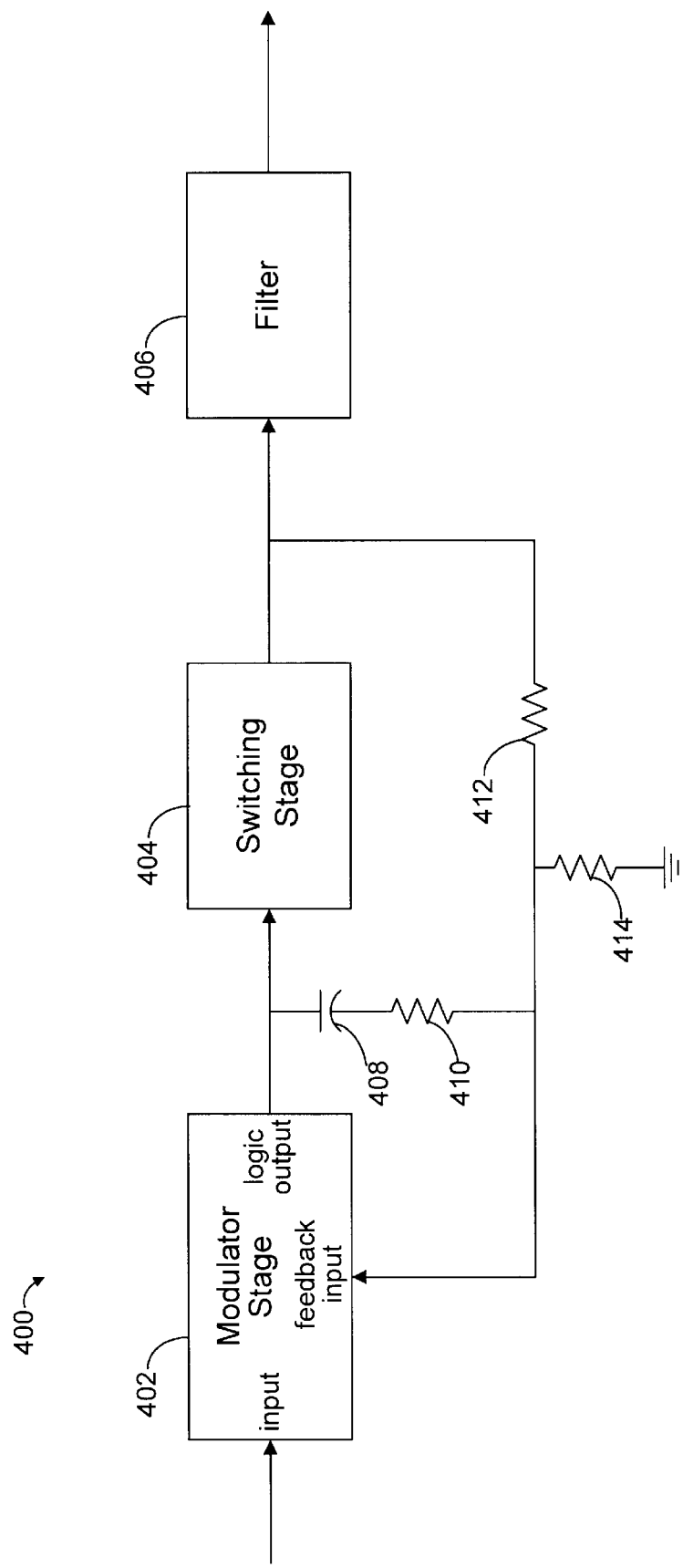
FIG. 4 is a block diagram of a modulator loop designed according to a more specific embodiment of the invention.

FIG. 4 is a block diagram of a baseband modulator loop 400 designed according to a more specific embodiment of the invention. Modulator 402, switching stage 404, and output filter 406 operate substantially similarly to the corresponding loop elements discussed above with reference to FIG. 3. Feedback is provided to the feedback input of modulator 402 from the output of switching stage 404 via a divider network comprising resistors 412 and 414. Feedback is also provided to the feedback input of modulator 402 from its logic output via filter capacitor 408 and series resistor 410. The value of capacitor 408 is selected to attenuate the logic output's signal content in the baseband range of interest while passing higher frequencies to the feedback path for combination with the attenuated switching stage signal. Significant increases in delay tolerance have been achieved with this configuration.

However, because the filtered modulator logic signal is not combined with the feedback path using an ideal filter and an ideal summer, an additional pole and zero are introduced to the transfer function of the loop by the actual circuit elements, i.e., capacitor 408 and resistor 410. This can be seen from a network analysis perspective by treating the logic output of modulator 402 as ground and observing that capacitor 408 adds delay to the loop by low pass filtering the switching stage output. This delay represents a limitation on the performance enhancements made possible by the use of the filtered modulator output as feedback. Therefore, further embodiments of the invention are described below introducing enhancements to the loop of FIG. 4 which address this limitation.

Figure 5:
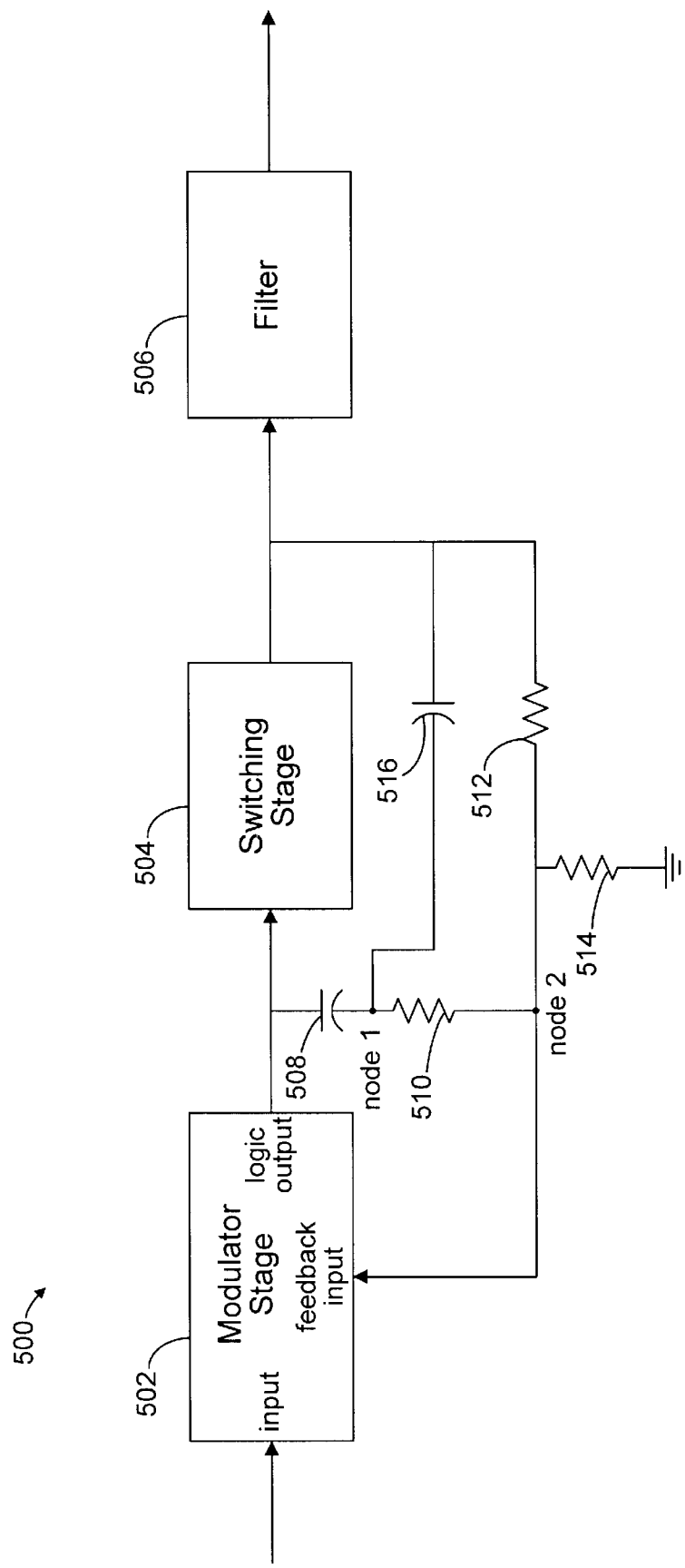
FIG. 5 is a block diagram of a modulator loop designed according to a still more specific embodiment of the invention.

FIG. 5 is a block diagram of a baseband modulator loop 500 designed according to a still more specific embodiment of the invention. Modulator 502, switching stage 504, and output filter 506 operate substantially similarly to the corresponding loop elements described above with reference to FIG. 3. As with the corresponding elements of loop 400, feedback is provided to the feedback input of modulator 502 from the output of switching stage 504 via a divider network comprising resistors 512 and 514. Feedback is also provided to the feedback input of modulator 502 from its logic output via filter capacitor 508 and series resistor 510. The value of capacitor 508 is selected to attenuate the logic output's signal content in the baseband range of interest while passing higher frequencies to the feedback path for combination with the attenuated switching stage signal.

An additional capacitor 516 is provided from the output of switching stage 504 to node 1 which cancels the pole introduced into the switching stage's feedback path by capacitor 508. This may be understood from a network analysis perspective by again treating the logic output of modulator 502 as ground and analyzing the feedback path from the output of switching stage 504. If the ratio of resistors 512 and 514 is made equal to the ratio of capacitors 516 and 508, the attenuation of the switching stage output seen at node 1 is the same as that seen at node 2, i.e., the voltage level should be the same. Because the voltages at nodes 1 and 2 are equal, there is no current through resistor 510 which can therefore be treated like an open circuit, effectively removing capacitor 508 and its corresponding pole from the switching stage feedback path. This makes the modulator loop extremely stable as well as delay tolerant.

Figure 6:
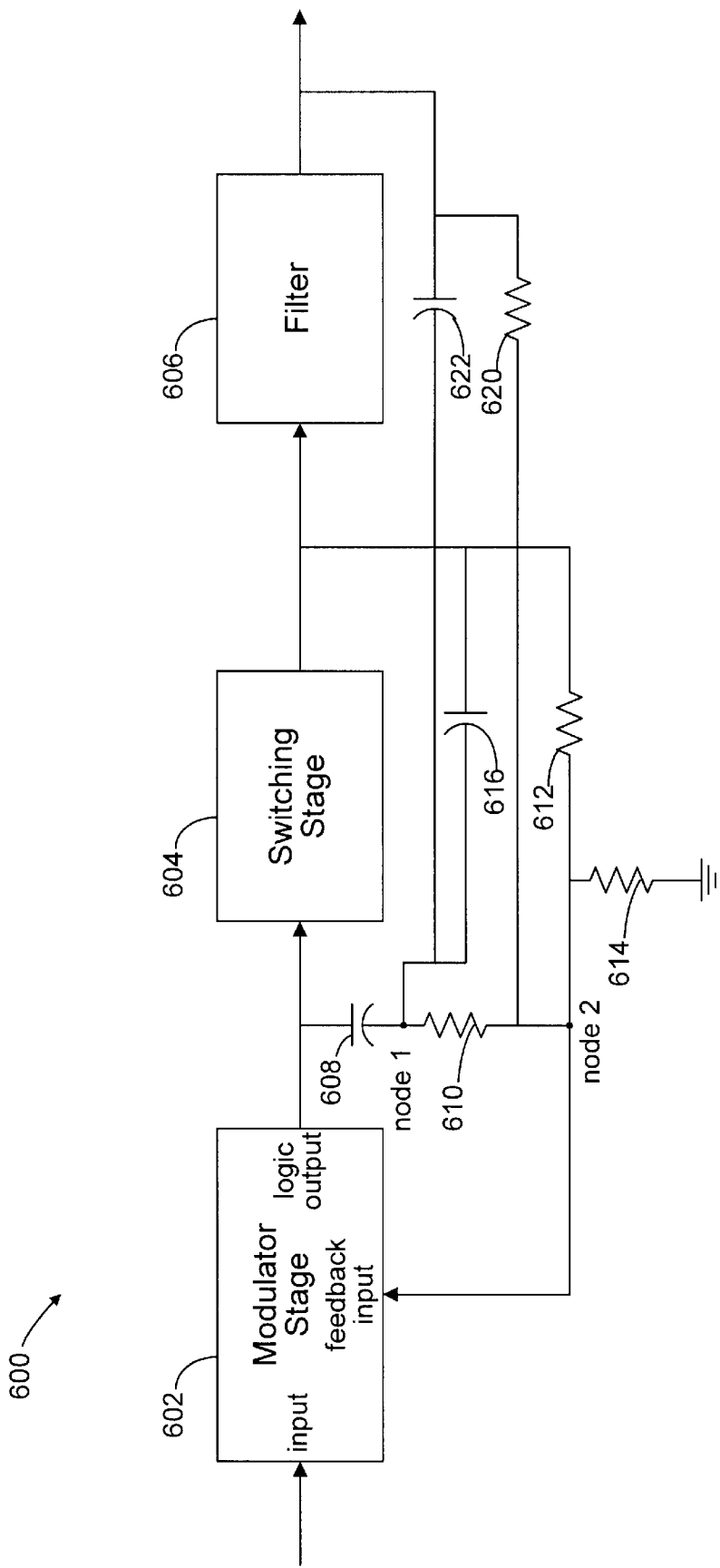
FIG. 6 is a block diagram of a modulator loop designed according to an even still more specific embodiment of the invention.

FIG. 6 is a block diagram of a modulator loop 600 designed according to an even still more specific embodiment of the invention. Modulator 602, switching stage 604, and output filter 606 operate substantially similarly to the corresponding loop elements described above with reference to FIG. 3. Resistors 610, 612 and 614 and capacitors 608 and 616 operate substantially similarly to the corresponding loop components described above with reference to FIG. 5. In fact, the embodiment of FIG. 6 includes all of the circuitry of FIG. 5 with the addition of a feedback path from the output of filter 606 to the feedback input of modulator stage 602, the additional feedback path being implemented with a resistor 620. Capacitor 622 is also included from the output of filter 606 to node 1 for the purpose of canceling the pole in the new feedback path introduced by capacitors 608 and 616. As discussed above with reference to the embodiment of FIG. 5, if the ratio of resistor 620 and resistor 614 in parallel with resistor 612 is made the same as the ratio of capacitor 608 in parallel with capacitor 616 and capacitor 622, no current flows in resistor 610 and thus, capacitor 608 is effectively removed from either feedback path.

Figure 7:
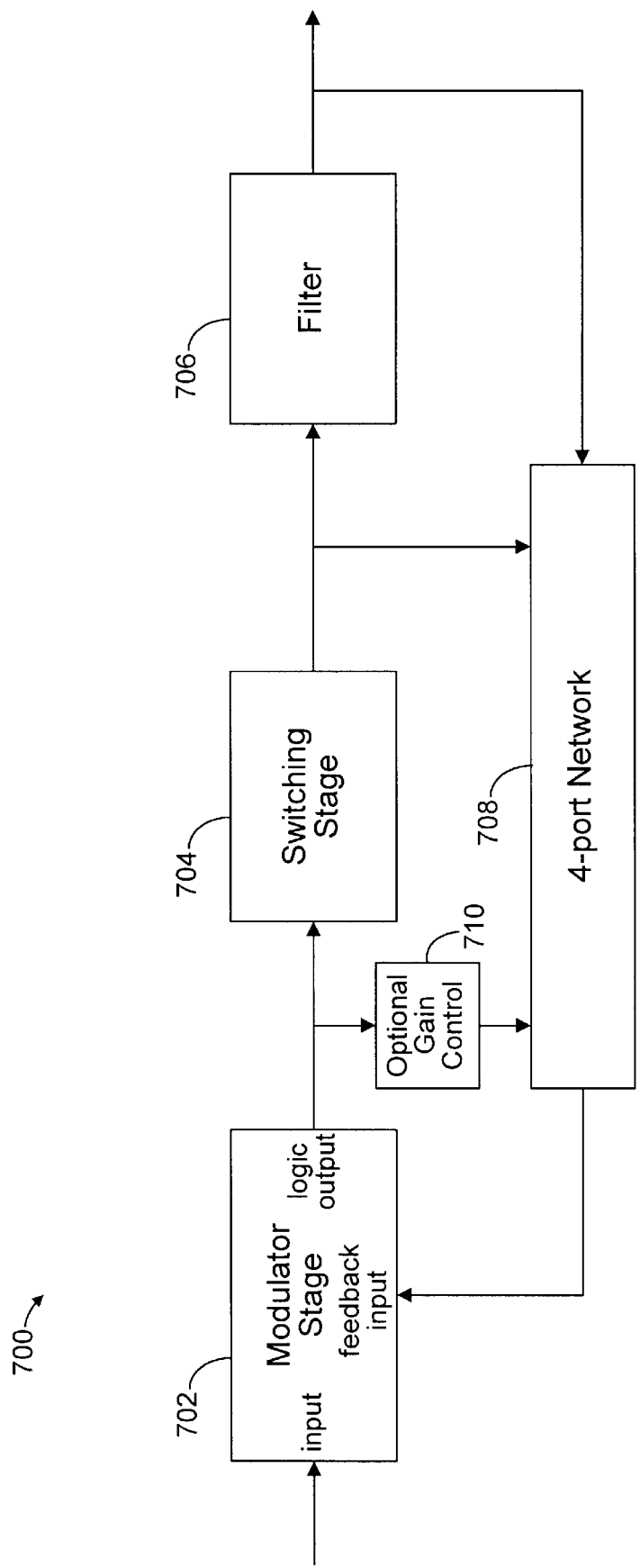
FIG. 7 is a block diagram of a generalized embodiment of a modulator loop designed according to the invention.

FIG. 7 is a block diagram of a generalized embodiment of a modulator loop 700 designed according to the invention. Replacing the feedback filter and signal combining circuitry of the previously described embodiments is a 4-port network 708 to which modulator stage 702, switching stage 704, and output filter stage 706 are connected. Network 708 takes the modulator logic output signal and attenuates its frequency content within the range of interest of modulator loop 700. It also combines the resulting signal with the fed back outputs of the switching and filter stages for use as feedback by modulator stage 702. Network 708 may be implemented in a variety of ways depending upon the technology used to implement modulator loop 700.

Moreover, for modulators having amplitude dependent stability (e.g., oversampled and pulse width modulators), it may be desirable to control the magnitude of the modulator feedback with respect to the feedback from the power and/or filter stages to maintain an optimal stability point. Therefore, an optional gain control 710 is provided before the feedback filter (included in 4-port network 708) to allow gain matching of the modulator logic output signal and the power output. According to a specific embodiment, gain control 710 is implemented using a digital-to-analog converter (DAC) with a variable output amplitude.

While the invention has been particularly shown and described with reference to specific embodiments thereof, it will be understood by those skilled in the art that changes in the form and details of the disclosed embodiments may be made without departing from the spirit or scope of the invention. For example, the specific embodiments described above with reference to FIGS. 4 and 5 show the use of analog components (i.e., resistors and capacitors) to both filter the modulator output and combine the resulting filtered feedback signal with the feedback path from the output of the switching stage. It will be understood, however, that, where, for example, the modulator stage is implemented using digital techniques, the circuitry and techniques used to filter and combine the feedback signal could be digital. Similarly, with a mixed-signal modulator, mixed-signal circuitry and techniques may be used to implement the feedback, e.g., combining signals at virtual grounds of op amps.

It should also be understood that, depending upon the degree to which the contents of the modulator and power outputs in the modulator loop's frequency range of interest are dissimilar, and the degree to which degradation of the loop's output may be tolerated, varying levels of attenuation of the modulator output's components in the range may be appropriate. That is, the frequency components in the modulator stage output which are within the loop's frequency range of interest need not be completely rejected to maintain reasonable fidelity and remain within the scope of the invention.

Figure 8:
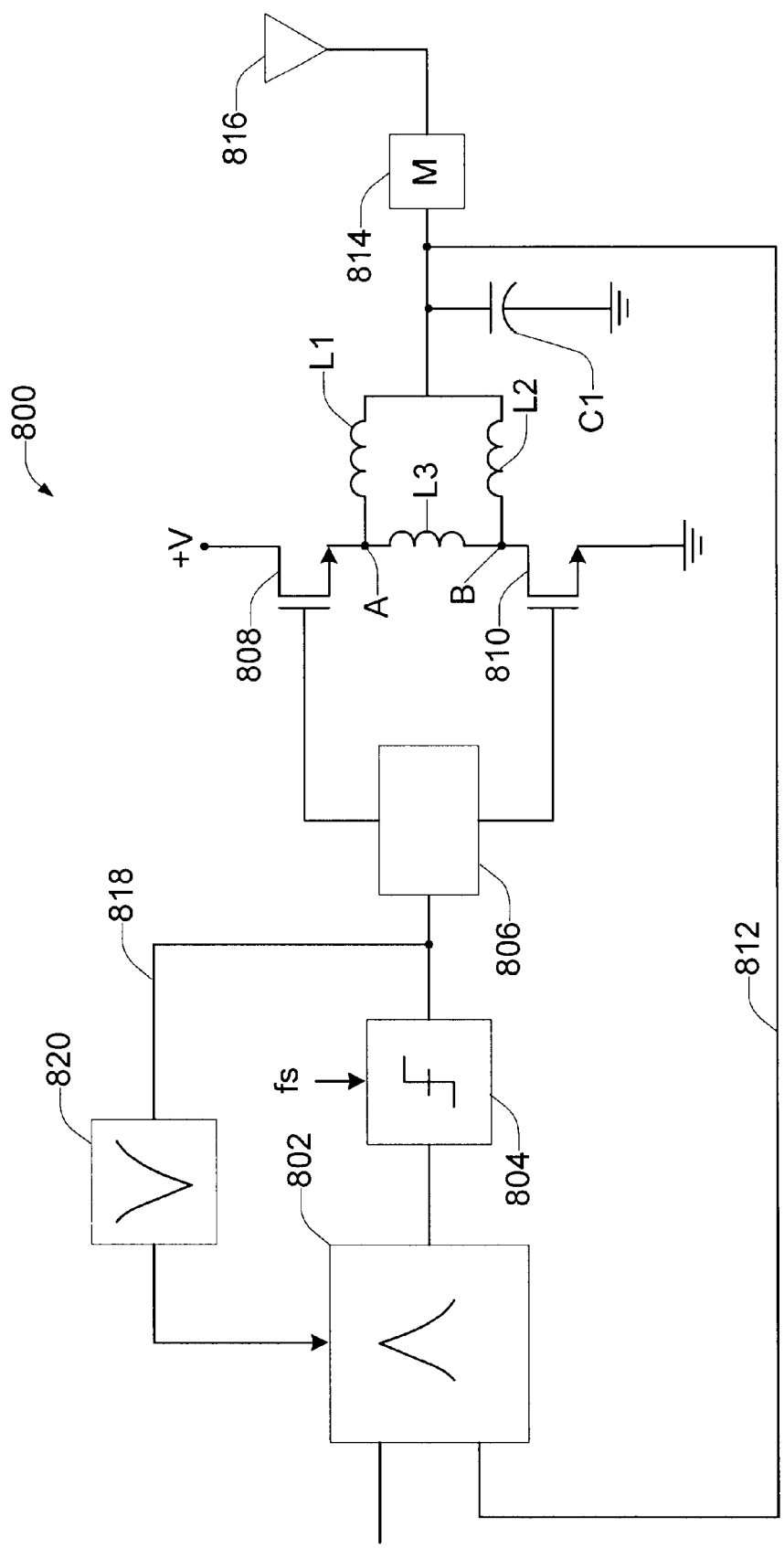
FIG. 8 is a block diagram of a band pass amplifier designed according to a specific embodiment of the invention.

FIG. 8 shows an RF band pass noise-shaping amplifier 800 designed according to the present invention as well as techniques described in U.S. Pat. No. 5,777,512 incorporated herein by reference above. Such an amplifier may be used, for example, in a wireless communication device such as a wireless phone, pager, network device, etc. RF amplifier 800 includes a frequency selective network 802 which, using continuous-time feedback, noise shapes the modulated RF input. According to a specific embodiment, network 802 comprises at least one resonator stage having a transfer function designed to pass a band centered around 900 MHz. Of course, it will be understood that the band pass frequency range of a noise shaping amplifier designed according to the present invention may center on any of a wide variety of frequencies such as, for example, 1.8 GHz, 2.4 GHz, etc., and that the present invention is not limited to any particular range or set of ranges.

A/D converter 804 converts the noise shaped RF signal to digital data using a sampling frequency fs which, according to a specific embodiment, is 3.6 GHz. According to one embodiment, A/D converter 804 comprises a comparator.

Gate drive circuitry 806 takes the pulse train from A/D converter 804 and generates gate drive for each of FETs 808 and 810 of the power output stage of amplifier 800. The output power stage shown includes three inductors L1, L2 and L3, and capacitor C1. This configuration creates two separate resonances at nodes A and B respectively when the corresponding one of FETs 808 and 810 is off. The continuous-time feedback to frequency selective network 802 is provided via feedback path 812. The output signal of the power stage is passed to a matching network 814 which passes the output RF signal to antenna 816 for transmission. As will be understood and according to various embodiments, feedback path 812 may originate within matching network 814.

The loop of amplifier 800 typically operates best with a loop delay equal to 1/fs, i.e., ⅓.6 GHz. To compensate for any additional and undesirable delay associated with the output power stage, amplifier 800 includes another feedback path 818 to frequency selective network 802 which includes a notch filter 820 having the same center point as network 802. The source of the feedback is shown as the output of A/D converter 804. However, it will be understood that there are several other points between this node and the input to the power stage from which the feedback may originate. Therefore, the scope of the present invention should not be limited to the embodiment shown. Rather, as with all of the embodiments described herein, the scope of the invention should be interpreted with reference to the following claims.

What is claimed is:

1. A modulator loop having an associated band pass frequency range, comprising:
    a switching stage having an input and an output, the switching stage having a first delay associated therewith;
    a modulator stage having an output and a feedback input, the output of the modulator stage being coupled to the input of the switching stage;
    a first feedback path coupled between the output of the switching stage and the modulator stage; and a notch filter corresponding to the band pass frequency range and coupled between the output of the modulator stage and the feedback input of the modulator stage for compensating for the first delay.

2. The modulator loop of claim 1 wherein the band pass frequency range comprises a radio frequency range.

3. The modulator loop of claim 2 wherein the band pass frequency range is centered at 900 MHz.

4. The modulator loop of claim 2 wherein the band pass frequency range is centered at 1.8 GHz.

5. The modulator loop of claim 2 wherein the band pass frequency range is centered at 2.4 GHz.

6. The modulator loop of claim 1 wherein the notch filter generates a feedback signal using analog techniques.

7. The modulator loop of claim 1 wherein the notch filter generates a feedback signal using digital techniques.

8. The modulator loop of claim 1 wherein the notch filter generates a feedback signal using mixed signal techniques.

9. The modulator loop of claim 1 wherein the notch filter is coupled directly to the output of the modulator stage.

10. The modulator loop of claim 1 wherein notch filter is coupled to the output of the modulator stage via intervening loop elements.

11. The modulator loop of claim 1 wherein the first feedback path is coupled to the modulator stage via the feedback input.

12. The modulator loop of claim 1 wherein the first feedback path is coupled to the modulator stage at a point other than the feedback input.

13. A radio frequency amplifier comprising the modulator loop of claim 1.

14. A wireless communication device comprising the modulator loop of claim 1.

15. The modulator loop of claim 1 wherein the first feedback path originates in a matching network coupled to the output of the switching stage.

* * * * *